United States Patent
Williams, Jr.

(10) Patent No.: US 8,853,639 B2
(45) Date of Patent: Oct. 7, 2014

(54) ACTIVE PIXEL SENSORS WITH VARIABLE THRESHOLD RESET

(71) Applicant: Voxtel, Inc., Beaverton, OR (US)

(72) Inventor: George Melville Williams, Jr., Beaverton, OR (US)

(73) Assignee: Voxtel, Inc., Beaverton, OR (US)

( * ) Notice: Subject to any disclaimer, the term of this patent is extended or adjusted under 35 U.S.C. 154(b) by 0 days.

(21) Appl. No.: 13/685,342

(22) Filed: Nov. 26, 2012

(65) Prior Publication Data

US 2013/0075593 A1   Mar. 28, 2013

Related U.S. Application Data

(63) Continuation of application No. 11/282,142, filed on Nov. 18, 2005, now Pat. No. 8,319,307.

(60) Provisional application No. 60/522,908, filed on Nov. 19, 2004.

(51) Int. Cl.
*H01L 27/146* (2006.01)

(52) U.S. Cl.
CPC .... *H01L 27/14612* (2013.01); *H01L 27/14636* (2013.01)
USPC .................................... 250/370.08

(58) Field of Classification Search
USPC .................................... 250/370.08
See application file for complete search history.

(56) References Cited

U.S. PATENT DOCUMENTS

| | | | |
|---|---|---|---|
| 5,276,329 A | 1/1994 | Hughes | |
| 5,315,101 A | 5/1994 | Hughes et al. | |
| 5,471,654 A * | 11/1995 | Okazaki et al. | 455/126 |
| 5,589,705 A | 12/1996 | Saito et al. | |
| 6,051,884 A | 4/2000 | Papadas | |
| 6,252,462 B1 | 6/2001 | Hoffman | |
| 6,380,572 B1 | 4/2002 | Pain et al. | |
| 6,697,111 B1 | 2/2004 | Kozlowski et al. | |
| 6,721,464 B2 | 4/2004 | Pain et al. | |
| 6,982,460 B1 * | 1/2006 | Cohen et al. | 257/331 |
| 7,851,738 B2 | 12/2010 | Sumi | |
| 2001/0005624 A1 | 6/2001 | Aoyagi et al. | |
| 2001/0030324 A1 | 10/2001 | Morikawa et al. | |
| 2002/0018133 A1 | 2/2002 | Mendis et al. | |
| 2002/0033439 A1 | 3/2002 | Bock | |

(Continued)

OTHER PUBLICATIONS

James Janesick, "Dueling Detectors." SPIE's oemagazine, Feb. 2002, pp. 30-33. <doi: 10.1117/2.5200202.0007>.*

(Continued)

*Primary Examiner* — Constantine Hannaher
(74) *Attorney, Agent, or Firm* — Klarquist Sparkman, LLP (57) ABSTRACT

A CMOS image sensor array has rows and columns of active pixels, and column lines in communication with the active pixels in the respective columns. Each active pixel has an output connected to a column line and includes a photodetector that produces a signal proportional to incident light intensity that is coupled to an active pixel output based on column select and row select signals. Each active pixel has a reset transistor for resetting the active pixel, wherein each reset transistor has a first gate terminal and a second gate terminal. The reset transistors have a variable threshold capability that allows increased sensor array dynamic range or mitigation of the effects of temperature or radiation induced transistor threshold voltage shifts. Row select, column select, and sense transistors can also be configured to have variable thresholds.

8 Claims, 7 Drawing Sheets

(56) References Cited

U.S. PATENT DOCUMENTS

| | | | |
|---|---|---|---|
| 2002/0093053 | A1 | 7/2002 | Chan et al. |
| 2002/0175269 | A1 | 11/2002 | Krymski |
| 2002/0192911 | A1 | 12/2002 | Parke |
| 2003/0016906 | A1 | 1/2003 | Utsunomiya |
| 2003/0133625 | A1 | 7/2003 | Pain et al. |
| 2004/0080646 | A1 | 4/2004 | Zhao et al. |
| 2004/0169740 | A1 | 9/2004 | Pain et al. |
| 2004/0174450 | A1 | 9/2004 | Lee et al. |
| 2004/0262494 | A1 | 12/2004 | Egawa et al. |
| 2005/0139833 | A1 | 6/2005 | Janesick et al. |
| 2005/0199967 | A1 | 9/2005 | Hoffman |

OTHER PUBLICATIONS

Stoppa et al., "Novel CMOS Image Sensor With a 132-dB Dynamic Range," IEEE J. of Solid-State Circuits, 37:1846-1852 (Dec. 2002).

Yadid-Pecht, "Wide-dynamic-range sensors," Opt. Eng., 38:1650-1660 (Oct. 1999).

Pain et al., "Photodiode-based CMOS APSs with zero-lag, low-noise design," NASA Tech Brief, 24:1-7 (Nov. 2000).

Fowler et al., "Reset Noise Reduction in Capacitive Sensors," IEEE Trans. on Circuits and Systems (draft submitted Jul. 13, 2005).

Degerli, "Monolithic active pixels with in-pixel amplification and reset noise suppression for charged particle detection in a 0.25μm digital CMOS process," internal report, CEA-Saclay (Jul. 8, 2003).

Tian et al., "Analysis of Temporal Noise in CMOS APS," SPIE 3649:177-185 (Jan. 1999).

Chen et al., "CMOS active pixel sensor achieving 90 dB dynamic range with column-level active reset," in Sensors and Camera Systems for Scientific, Industrial, and Digital Photography Applications V, Blouke et al., eds., 438-449 (Jun. 7, 2004).

Pain et al., "A Single-chip Programmable Digital CMOS Imager with Enhanced Low-light Detection Capability," 13th Int'l Cont. on VLSI Design, 432 (2000).

Fowler et al., "Low Noise Readout using Active Reset for CMOS APS," Proc. SPIE, 3965:126-135 (Jan. 2000).

Janesick, "Charge coupled CMOS and hybrid detector arrays," conference on Focal Plane Arrays for Space Telescope, SPIE (Aug. 2003).

\* cited by examiner

PRIOR ART

FIG. 3B

VOLTAGE

FIG. 4A

PRIOR ART

FIG. 4B

VOLTAGE

ACTIVE PIXEL SENSORS WITH VARIABLE THRESHOLD RESET

CROSS REFERENCE TO RELATED APPLICATIONS

This application is a continuation of U.S. patent application Ser. No. 11/282,142, filed Nov. 18, 2005, which claims the benefit of U.S. provisional application 60/522,908, filed Nov. 19, 2004, both of which are incorporated herein by reference.

FIELD

The disclosure pertains to semiconductor imaging devices.

BACKGROUND

Image sensors find applications in a wide variety of fields, including machine vision, robotics, astronomy, navigation, and consumer products. While complementary metal-oxide-semiconductor (CMOS) technology has provided the foundation for advances in low-cost, low-power, reliable, highly integrated systems for many consumer applications, charge coupled devices (CCDs) have been, until recently, the primary technology used in electronic imaging applications. CCDs, however, are high capacitance devices that require high voltage clocks, consume large amounts of power, provide only serial output, and require specialized silicon processing that is incompatible with CMOS technology.

The availability of sub-micron CMOS technology and the advent of active pixel sensors (APS) have made CMOS technology more attractive for imaging applications. Active pixel sensors have transistors within a pixel unit cell to provide amplification and use manufacturing processes that are compatible with CMOS processes. Small pixel sizes, low noise, high speed, and high dynamic range have been demonstrated in such CMOS imagers using a variety of designs. The expected scaling of MOS devices to even smaller geometries can improve the operation and application of most CMOS-based integrated circuits, but such scaling can adversely affect the performance of imagers.

Most CMOS imagers are based on photodiode (PD) pixels because of design simplicity and conformity to conventional CMOS processes. The PD pixel is comprised of four major components. The PD region is responsible for generating and collecting signal charge. Three MOSFETs are required to measure the charge on the diode: (a) a source follower MOSFET, which converts signal charge to an output voltage, (b) a reset MOSFET, which resets the photodiode before charge is integrated on the diode, and (c) a row-select MOSFET, which selects a line for scanned readout.

CMOS image sensors benefit from technology scaling by reducing pixel size, increasing resolution, and integrating more analog and digital circuits on the same chip with the sensor. At 0.25 µm and below, however, digital CMOS technology is not directly suitable for building high quality image sensors. The use of shallow junctions and high doping results in low photoresponsivity, and the use of shallow trench isolation (STI), thin gate oxide, and salicide cause high dark current. Furthermore, signal electrons generated in the silicon should remain in the target pixel. Thermal diffusion and weak electric fields within a pixel's active volume cause signal electrons to wander into neighboring pixels, creating cross talk and related modulation-transfer-function (MTF) loss, and poor color performance. Therefore, it is important that the charge collecting electric fields within the photo region of the pixel be sufficiently deep to match the photon absorption depth. Pixel cross talk is most conspicuous for near-IR and soft x-ray photons that penetrate deep into the sensor, where weak electric fields exist. CMOS arrays show relatively poor charge collection efficiency (CCE) because standard foundry processes use low-resistivity silicon wafers (typically <10 ohm-cm) and are configured for low voltage drive (<3.3 V). Low-resistivity material is necessary to prevent cosmic-ray/radiation-event-triggered CMOS circuit latch-up and ground-bounce problems associated with support CMOS electronic circuitry. Also, low-voltage operation inherent to CMOS, reduces electric field depth. This problem is becoming severe because operating voltages decrease proportionally to feature size. For example, state-of-the-art 0.18-µm CMOS processes operate at only 1.8 V. Design rules and operating voltages will decrease as CMOS technology advances. To compound the problem, the depletion region associated with the photo region decreases as signal charge collects. This technology is discussed in, for example, Janesick., "Charge coupled CMOS and hybrid detector arrays," SPIE Conference on Focal Plane Arrays for Space Telescopes, paper #5167-1, San Diego (August 2003). Pixel cross talk also increases dramatically as pixel size is reduced.

Pixel transistor leakage also becomes a significant source of dark current. Indeed, in a standard process, dark current due to reset transistor off-current and the follower transistor gate leakage current in a CMOS APS pixel can be orders of magnitude higher than the diode leakage itself. Furthermore, as transistor threshold voltages consume an increased fraction of the reduced operating voltages of sub-micron CMOS circuits, imager dynamic range is reduced.

Low-frequency noise in silicon MOSFETs is dominated by flicker noise. Such noise is commonly known as 1/f noise since the noise spectral density is inversely proportional to frequency. MOSFET flicker noise limits signal levels that can be processed by VLSI devices and circuits. Much effort has been directed to understanding and reducing this noise for better performance in VLSI circuits. In the carrier-density fluctuation model, the noise is explained as a fluctuation of the channel free carriers due to the random capture and emission by interface traps known as slow states. Using this model, the input referred noise is independent of gate bias voltage and the magnitude of the noise spectrum is proportional to the density of the interface trap density.

The problem of fixed pattern noise (FPN) in active pixel sensors is also well known. FPN refers to a non-temporal spatial noise and is due to device mismatches in pixels, color filters, variations in column amplifiers, and mismatches between multiple PGAs and ADCs. FPN can be either coherent or non-coherent. Dark current FPN due to mismatches in pixel photodiode leakage currents tends to dominate the non-coherent component of FPN, especially with long exposure times. Again, as with pixel dark current shot noise, low leakage photodiodes are preferable to reduce this FPN component. Dark frame subtraction is an option, but this tends to increase the read-out time of the sensor. The most problematic FPN in image sensors is associated with easily detectable (or coherent) row-wise and column-wise artifacts due to mismatches in multiple signal paths, and un-correlated, row-wise operations in the image sensor. Coherent FPN offset components can generally be eliminated by reference frame subtraction. Gain mismatches are more difficult to remove since they require time or hardware intensive gain correction. It is worthwhile to improve the circuits in order to reduce residual FPN to the lowest possible value, especially for CMOS imagers for space use when the above problems are related to radiation effects on the change in imager threshold voltages.

Two strategies can be used to address these problems. First, proper guarding can be used for transistor leakage paths that are created by positive charge build up in the oxides. Dedicated layout techniques can be used for pixels as well as for peripheral circuitry. Second, measures can be taken at the circuit level. Analog circuits can be designed to have low sensitivity to transistor parameters that are affected by radiation such as MOSFET threshold voltage.

In addition, device design must permit any FPN specification to remain valid after the device is exposed to radiation. The performance of some conventional FPN correction circuits is impaired by exposure to radiation, yielding higher residual FPN values after radiation exposure. Higher pixel readout rates are also needed. Fast column multiplexing is the readout speed bottleneck for large devices. Since many of conventional fixed pattern noise reduction circuits need signal multiplexing at double the readout rate, maximum readout speeds are limited.

In contrast to bulk CMOS technology, silicon-on-insulator (SOI) CMOS technologies use SOI wafers that include three layers: a single-crystal layer of silicon, upon which integrated circuits are fabricated; a base silicon substrate; and a thin insulator that electrically insulates the single-crystal layer and the substrate. This thin insulator reduces parasitic capacitance typically associated with circuit devices and a substrate in conventional bulk processes. Device operation in SOI-based devices is similar to that of bulk devices, except that transistors and other circuit elements do not share a common substrate. Such SOI processes can produce devices that exhibit lower power consumption and higher processing speeds than conventional bulk devices. Pain et al., U.S. Pat. No. 6,380,572, and Zhang et al., "Building Hybrid Active Pixels for CMOS Imagers in SOI Substrates," IEEE International SOI Conference (1999), disclose active pixel sensors in which photodetectors are formed in a bulk silicon substrate and circuit elements are formed in a SOI silicon layer. The SOI silicon layer is separated from the bulk silicon by a buried oxide (BOX) layer.

Fabricating CMOS imagers on SOI wafer substrates improves performance. For example, the SOI MOSFETs are isolated from photo regions, allowing high resistivity silicon to be used. In addition, CMOS circuit ground returns for SOI are isolated, eliminating substrate bounce and transient coupling problems. This allows higher operating speeds and lower noise. SOI also makes it easier to passivate surfaces for low dark-current generation because of the planar structure of SOI devices. This advantage, in turn, makes the device more suitable for high-energy radiation environments. Lower FPN and lower power consumption have also been reported for SOI. Some improved imagers based on thinned CMOS SOI substrates and back illumination are described in Williams, U.S. Patent App. Pub. 2005/0205930 that is incorporated herein by reference.

These disclosures address methods of manufacturing sub-micron SOI CMOS imaging devices with deeply-depleted charge collection regions, but they do not address the other limitations of sub-micron CMOS scaling, such as decreased dynamic range and transistor leakage current which can degrade the performance of sub-micron CMOS imaging devices. Furthermore, while SOI-MOS devices can provide several advantages over bulk-CMOS devices, their thin silicon layers can make them unsuitable for imagers. Many semiconductor wafers and die are inefficient at absorbing longer wavelength visible and near infrared (NIR) radiation. As a result of these problems, process modifications are mandatory to obtain practical devices.

Figure 1:
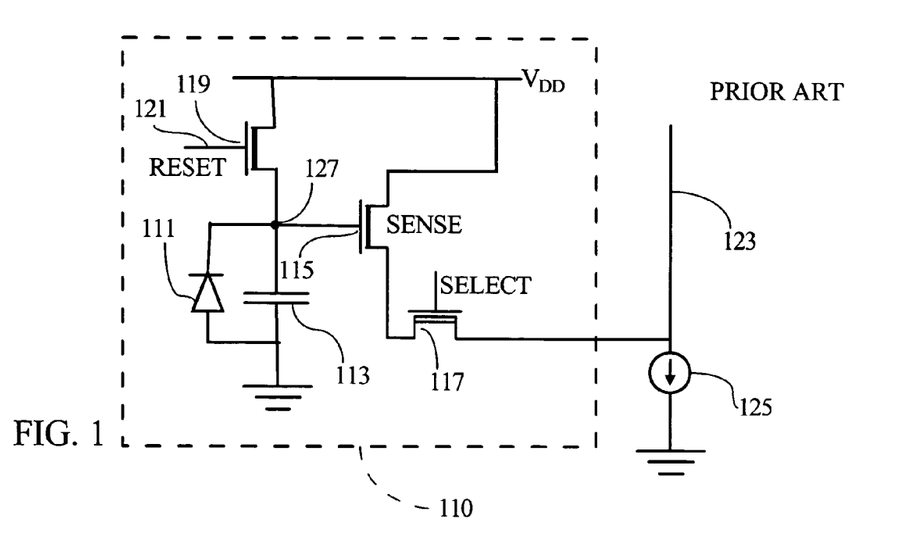
FIG. 1 is a schematic diagram of an active pixel sensor.
Figure 2:
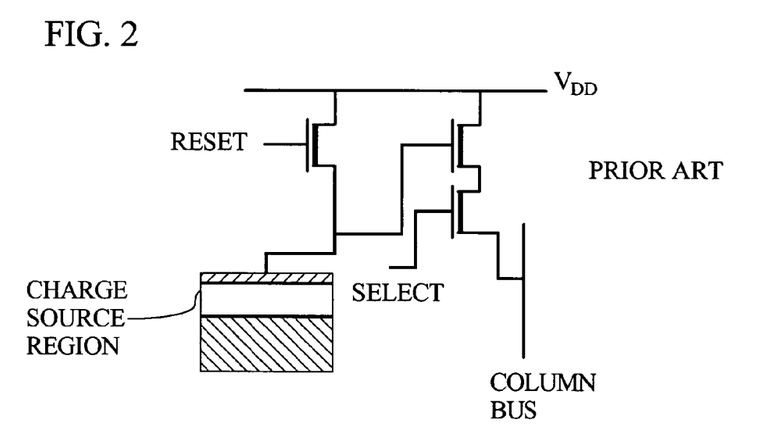
FIG. 2 is a schematic diagram of an active pixel sensor that includes a depletion region in which free carriers can be generated by an incident light flux.

FIGS. 1-2 are schematic diagrams of conventional active pixels. With reference to FIG. 1, an active pixel 110 includes a photodiode 111 that produces a current proportional to an incident light intensity. A resulting photocurrent is integrated on a charge-sensing capacitor 113. The charge-sensing capacitor 113 is typically based on a reverse-biased PN junction capacitance associated with the photodiode 111 and other parasitic capacitance. Alternatively, for devices, such as deeply depleted SOI CMOS imagers, which are characteristically low capacitance, the capacitor can be provided as a polysilicon-oxide-polysilicon or metal-oxide-metal capacitor. A MOS transistor 115 operates as a source-follower that buffers the voltage on the capacitor 113 nondestructively to a column line 123. A row select MOS switch 117 activates the source-follower transistor 115 when the particular row is selected by connecting the column current source 125 to the source of the source-follower transistor 115.

Active pixels such as the pixel 110 must be reset in order to permit image updates. There are two conventional ways to reset an active pixel that are typically referred to as a "soft" reset and a "hard" reset. When using a "soft" reset, the voltage at a gate 121 of a reset transistor 119 is raised to a voltage that is no higher than the threshold voltage of the reset transistor ($V_{RTTH}$) above the drain voltage of the reset transistor 119, typically at $V_{DD}$. Generally, the voltage at the gate 121 is raised to the same potential as the drain voltage $V_{DD}$. As the capacitor 113 is charged by the current from the reset transistor 119, the voltage at a sense node 127 increases, decreasing the gate-to-source voltage of the reset transistor 119. This in turn decreases the current from the reset transistor 119, and the rate of voltage rise at the sense node 127 decreases. As the gate-to-source voltage of the reset transistor 119 approaches the threshold voltage $V_{RTTH}$ of reset transistor 119, the current through the reset transistor 119 becomes extremely low, and the voltage at the sense node 127 rises very slowly. The voltage at the sense node 127 approaches approximately ($V_{DD}$-$V_{RTTH}$) but it never reaches a steady state because the rate of the voltage change slows. Then, the voltage at the gate 121 is lowered, typically to ground, completing the reset process. At this time, the voltage at the sense node 127 is approximately ($V_{DD}$-$V_{RTTH}$).

In hard reset, the gate voltage of the reset transistor 119 is raised to a voltage greater than the drain voltage of the reset transistor by at least $V_{RTTH}$. Typically, the gate voltage of reset transistor 119 is raised to $V_{DD}$ while the drain voltage of the reset transistor is maintained at a reset voltage $V_{RESET}$ that is lower than ($V_{DD}$-$V_{RTTH}$). This drives the reset transistor 119 into the triode region, thereby causing the transistor 119 to behave like a resistor. The reset transistor 119 and the sense capacitor 113 behave like an RC circuit, and the sense node voltage approaches $V_{RESET}$ with an RC time constant $\tau = R_{ON} C$, where $R_{ON}$ is the ON resistance of the reset transistor 119 and C is the value of the sense capacitor 113. Since the sense capacitance is on the order of a few femtofarads and the ON resistance is a few tens of kohms, the time constant is on the order of only a nanosecond. Thus, the sense node typically reaches the full steady-state value $V_{RESET}$ within a few nanoseconds, which is much shorter than typical reset period of many microseconds. Then, the voltage at the gate 121 is lowered typically to ground, completing the reset process. At this time, the sense node 127 is reset to approximately $V_{RESET}$.

It is well known that by using a "soft" reset, one can realize a lower reset noise than that obtained using a "hard" reset. Thus, it is desirable from signal-to-noise ratio and sensitivity point of view to use "soft" reset. However, since the sense node never reaches a steady state value using soft reset, the voltage of the sense node is actually reset to different voltages depending on the initial condition on the sense node. This leads to substantial image lag. Even with popular double sampling methods, a significant amount of image lag remains, which gives a blurry picture of moving objects. Furthermore, it is well known that by using a "hard" reset, one can substantially eliminate the image lag because the voltage to which the pixel is reset is always $V_{RESET}$. However, the disadvantage of using a "hard" reset is that higher reset noise is realized. Therefore it is desirable to provide an imaging reset methodology and/or circuitry for an imager that provide a resetting capability, wherein reset noise is significantly reduced, image lag is substantially eliminated, a desirable signal-to-noise ratio is realized, and/or the imager realizes a desirable sensitivity.

Another major barrier in deep-submicron CMOS APS design is the significant reduction of available output swing with the aggressive reduction of power supply voltage. Reducing power supply voltages with APS impacts available SNR and dynamic range because of the lower allowable signal voltages and larger voltage fluctuations due to noise currents.

Figure 3A:
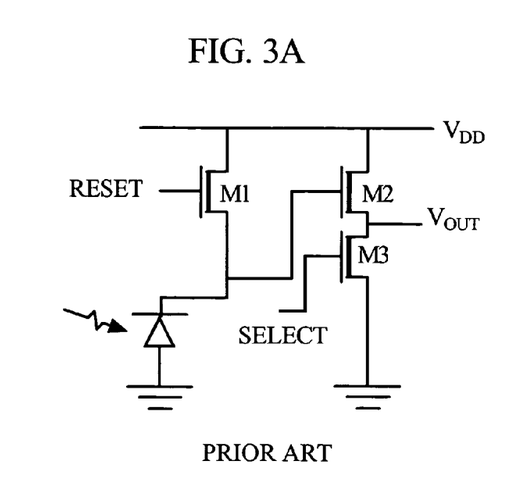
FIGS. 3A-3B illustrate a conventional pixel and an available output voltage range for such a pixel, respectively.
Figure 3B:
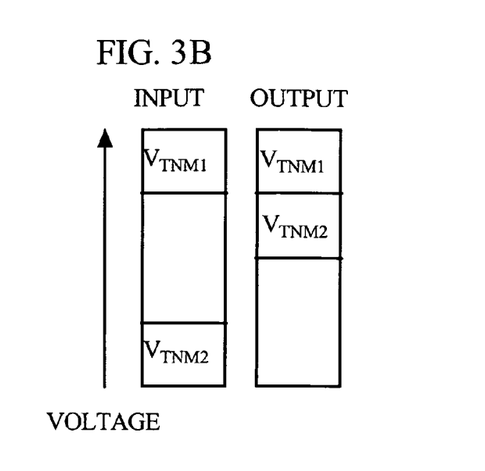

FIGS. 3A-3B illustrate the limited available output voltage swing $V_{OUT}$ for a conventional APS using NMOS transistors based on an input voltage swing $V_{IN}$. Threshold voltage contributions from transistors M1 and M2 contribute $V_{TM1}$ and $V_{TM2}$ respectively, and at an output node the two threshold drops combined can contribute approximately 1.6 V, which for a 3.3 V process is approximately 50 percent of the output dynamic range. To increase the voltage swing and dynamic range of a conventional APS, bootstrapped reset pulses can be used. However, bootstrapping techniques result in hot-carrier reliability issues in subquarter micron technology and significantly reduce circuit lifetime.

Figure 4A:
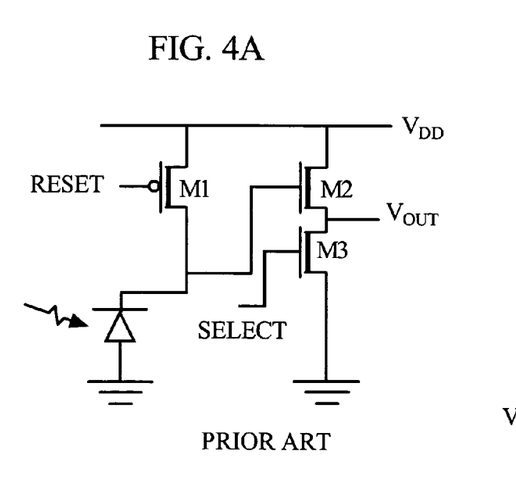
FIGS. 4A-4B illustrate a conventional pixel that includes a PMOS FET reset transistor and an available output voltage range for such a pixel, respectively.
Figure 4B:
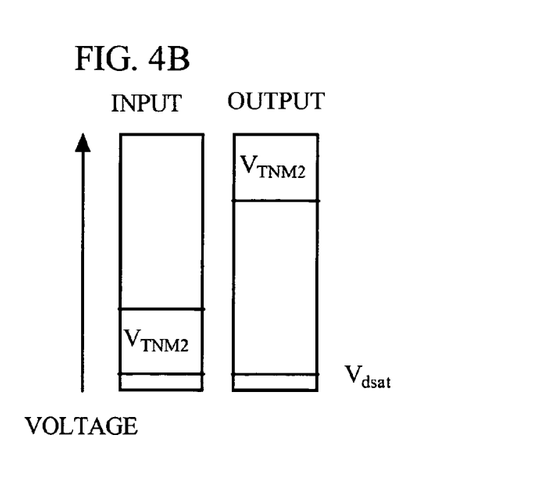

Alternatively, PMOSFETs can be used as reset transistors. FIGS. 4A-4B illustrate APS performance using a PMOSFET as a reset transistor. By replacing the NMOS reset transistor of FIG. 3A with a PMOS transistor, output dynamic range is increased by the threshold drop associated with transistor M1. However, the use of PMOSFETs in bulk CMOS processes requires an extra well to be included in the pixel, enlarging pixel size and making the fill factor lower, both of which are undesirable. This drawback, however, can be partially compensated with more aggressively scaled technology to further reduce device size. Applying such techniques on a silicon-on-insulator (SOI) substrate allows the APS to function at lower supply voltages. However, further reduction in power supply voltage remains difficult, because the methods used only increase the input available swing of the pixel, but the output swing is still limited by the turn-on condition of the in-pixel amplifier, normally a source follower, that causes an extra voltage reduction by $V_T+V_{Dsat}$, wherein $V_T$ is the threshold voltage and $V_{Dsat}$ and is the saturation drain voltage.

In view of these and other shortcomings of existing imagers and imaging methods, improved active pixel sensors, manufacturing processes, and imaging methods are needed.

SUMMARY

Photodetectors and ionizing radiation detectors comprise a readout layer having at least one double-gated transistor defined therein and a radiation detection layer that defines a radiation detection region. The radiation detection region is in electrical communication with the at least one double-gated transistor defined in the readout layer. The double gated transistor includes a first gate and a second gate that are configured to be independently biased.

In some examples, the readout layer is a silicon layer, the radiation detection layer is defined in a silicon substrate, and an insulator layer is situated between the radiation detector layer and the readout layer. In other examples the double gated transistor includes a source terminal, a drain terminal, a first gate terminal, and a second gate terminal, wherein at least one of the first gate terminal and the second gate terminal is coupled to receive a threshold voltage control signal. The gate terminals can be metallic, or be otherwise configured to be substantially opaque to radiation to be sensed in the radiation detection region. In representative examples, the double gated transistor includes a channel region and at least one of the first gate terminal and the second gate terminal are situated to substantially block optical radiation from reaching the channel. In some particular examples, the first gate terminal of the double gated transistor is situated to substantially prevent optical radiation directed to the radiation detection layer through the readout layer from reaching the channel region or the second gate terminal of the double gated transistor is situated to substantially prevent optical radiation directed from the radiation detection layer to the readout layer from reaching the channel region. In another example, the second gate terminal is a bottom gate terminal that is biased to substantially prevent electric fields associated with biasing of the silicon substrate from introducing a voltage potential in the channel of the double-gated transistor. In typical examples, a source or drain terminal of the double gated transistor is coupled to the radiation detection region and the double gated transistor includes a gate terminal configured to receive a reset signal. In some examples, the double gated transistor is a PMOSFET or an NMOSFET.

In additional examples, a plurality of double-gated transistors and a corresponding plurality of radiation detection regions are provided, wherein each of the plurality of radiation detection regions is in electrical communication with a corresponding double gated transistor. In additional examples, each of the double gated transistors includes a first gate terminal and a second gate terminal, wherein the first gate terminal is coupled to receive a threshold control voltage and the second gate terminal is coupled to receive a reset control signal. In further examples each radiation detection region is coupled to a gate of a corresponding sense transistor, and each sense transistor is coupled to a corresponding reset transistor. In additional examples, the sense transistors are double gated transistors configured to, for example, increase gain and/or to reduce 1/f noise. In some examples, the double gated sense transistors include a bottom gate and a top gate, and the bottom gate is configured for reverse bias, forward bias, or the bottom gate is grounded or tied to the top gate.

Controllers for an imager comprise a reset output configured to supply a reset signal to an imager and a threshold select signal configured to supply a voltage to the imager to select a threshold voltage of a reset transistor. In some examples, the threshold voltage is selected based on an imager temperature. In other examples, the threshold voltage is a variable voltage.

In another example, row-wise and column-wise readout signal artifacts due to mismatches in multiple signal paths and un-correlated, row-wise operations in the image sensor are compensated by selecting or adjusting the threshold voltage of the double-gated transistor. Such compensation can be used to, for example, mitigate the effects of radiation exposure.

In additional examples, an array controller is configured to provide a threshold adjustment signal configured to establish a threshold voltage of at least one transistors, and the threshold adjustments are obtained by varying clock signal voltages. In a representative example, threshold voltage is selected based on digitized pixel signal values.

Methods comprise selecting a threshold voltage for a pixel reset transistor, sense transistor, row or column select transistor or other transistor and applying a control voltage to at least one transistor based on the selected threshold voltage. In some particular examples, the threshold voltage is selected based on an intended pixel dynamic range. In further examples, the threshold voltage is selected based on an intended pixel signal to noise ratio.

Imaging systems comprise an array of pixels, each pixel including a radiation detection region electrically coupled to a source or drain of a sense FET such as a double gated FET, and the sense FET coupled to a source or drain of a double gated FET reset transistor. An array controller is configured to hard reset a sense node and soft reset the sense node by applying hard reset signal and a soft reset signal, respectively, to at least one gate of a reset transistor in each pixel. In representative examples, the hard and soft reset signals are selected to provide a predetermined image lag and linearity based on an intended illumination level at at least one radiation detection region. In additional examples, the array controller is configured to provide a threshold adjustment signal configured to establish a threshold voltage of at least one reset transistor. According to representative examples, the threshold adjustment signal is based on an ionizing radiation flux incident to the array of pixels or an imager temperature of operation. In other examples, the reset transistors include bottom gates and the array controller is configured to apply a bias to the bottom gates to reduce imager sensitivity to substrate bias.

The foregoing and other objects, features, and advantages of the disclosed technology will become more apparent from the following detailed description, which proceeds with reference to the accompanying drawings.

DETAILED DESCRIPTION

As used in this application and in the claims, the singular forms "a," "an," and "the" include the plural forms unless the context clearly dictates otherwise. Additionally, the term "includes" means "comprises." Further, the term "coupled" means electrically or electromagnetically connected or linked and does not exclude the presence of intermediate elements between the coupled items.

Disclosed below are representative embodiments of imagers and associated circuitry and methods of operation that can be used in detection of electromagnetic radiation or charged particles. Exemplary environments and applications for the disclosed embodiments are also disclosed. The described systems, apparatus, and methods should not be construed as limiting in any way. Instead, the present disclosure is directed toward all novel and nonobvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

Figures 5, 6A, 6C:
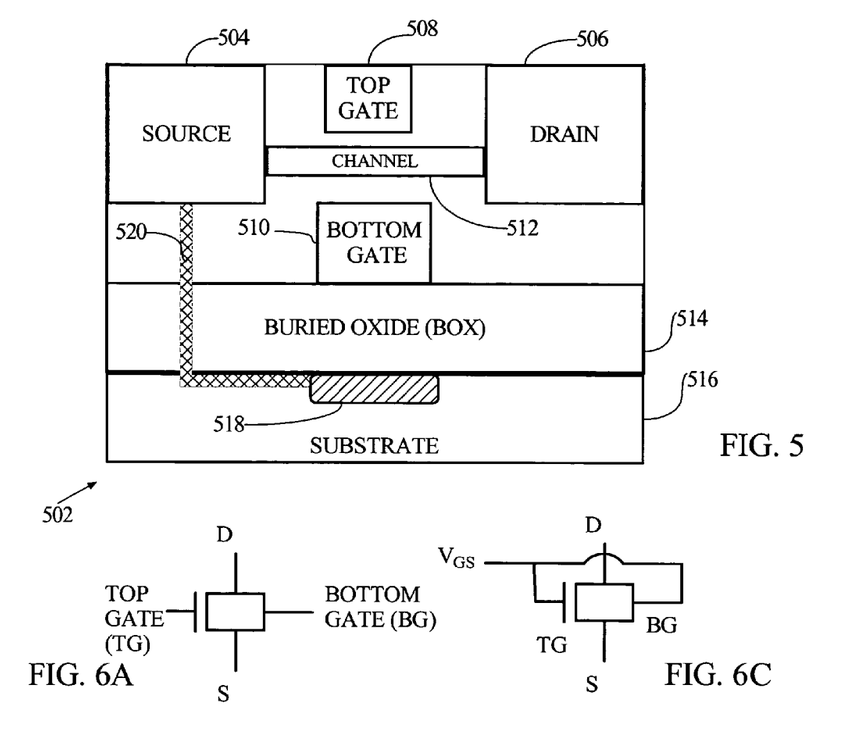
FIG. 5 is a schematic sectional diagram of a double gated MOS FET.
FIGS. 6A-6E are electrical schematic diagrams illustrating electrical connections of a double gated MOS FET.

With reference to FIG. 5, a representative four terminal MOSFET 502 includes a drain region 504, a source region 506, a top gate 508, a bottom gate 510, and a channel region 512. The MOSFET 502 is situated on, for example, an oxide layer 514 that is typically formed as part of a silicon-on-insulator (SOI) process. The oxide layer 514 is generally situated on a silicon substrate or a silicon or other layer 516, in which a radiation detection region 518 is defined and coupled to the source 504 by a conductor 520. A shown in FIG. 5, the gates are configured to attenuate radiation from the radiation detection region from reaching the channel 512. Fabrication details for such four terminal FETs and dynamic threshold MOSFET devices (DTMOS) can be found in, for example, Parke, U.S. Patent App. Pub 2002/0192911 or Pain et al., U.S. Patent App. Pub. 2004/0169740 that are both incorporated herein by reference. A double gate, DTMOS structure can comprise a silicon transistor in which the gate is constructed of two conducting layers and a capping insulating layer that are all embedded in a groove etched into a SOI or epitaxial silicon layer. The resulting DTMOS device is a substantially planar structure with low gate, body, and source/drain resistances. The gate layers can be deposited after high-temperature source/drain processing is complete, thus protecting the gate layers from possible high-temperature damage. A compact, low capacitance endwall (sometimes referred to as a sidewall) contact is formed between the top gate material and a self-aligned hyper-abrupt retrograde body. In one example, this DTMOS structure can be built on a high-resistivity SOI wafer. In another example, a high-resistivity epitaxial bulk silicon wafer is used, permitting typical triple well processing to be eliminated. The top gate can be Ti/Ni/Al rather than the conventional polycide gate, and gate oxide thickness can be from about 6 nm to about 40 nm. Such DTMOS devices can be integrated with conventional CMOS devices (non-DTMOS) in the same circuit and/or on the same chip to, for example, reduce image lag, increase dynamic range of sub-micron CMOS imagers, decrease leakage voltage, decrease noise, decrease imager sensitivity to substrate effects, and increase imager radiation tolerance.

According to the disclosed technology, CMOS photodiode, photogate, avalanche photodiode, and other electromagnetic radiation and/or particle radiation sensors that can be incorporated into, for example, imagers, can be fabricated using either bulk CMOS or silicon-on-insulator (SOI) wafer processes. These photodetector circuits can be improved through the use of double gated and variable threshold MOSFET devices such as illustrated in FIG. 5. In representative examples, one or a mix of variable threshold, double gated transistors can be used to improve imager performance. For purposes of illustration, six electrical configurations of the transistor of FIG. 5 are shown in FIGS. 6A-6E, each configuration suitable for partially depleted (PD) and/or fully depleted (FD) operation at each available power supply level. Applying all, or a mix, of these transistor-operating modes to imager designs can significantly improve imager performance.

Figure 6B:
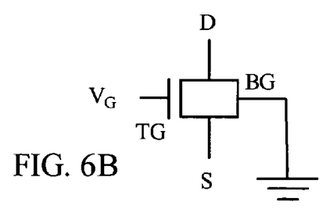
Figure 6D:
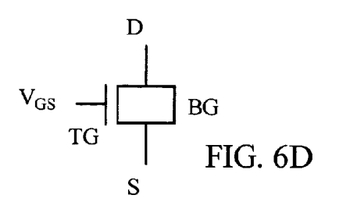
Figure 6E:
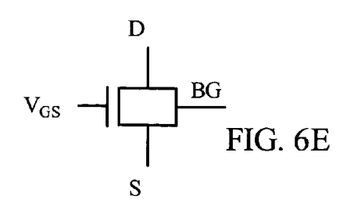

Schematic representations of various modes of operation are shown in FIGS. 6A-6E. A body-tied (BT) SOI FET mode is shown in FIG. 6B. A floating bottom gate (FB) mode (FIG. 6D) is similar to a conventional FD SOI device without a bottom gate. In a dynamic threshold (DT) mode (FIG. 6C), a top gate (TG) is connected to a bottom gate. The DT mode can be useful for ultra-low-voltage (0.5-1.0 V) circuits, particularly analog circuits. A lateral JFET (BJT) mode connects only the bottom gate to the input signal, and is suited for use in bandgap reference, low-noise, and other analog imaging sensing and signal processing applications. A double-gate (DG) mode (FIG. 6E) has several sub-configurations: the grounded bottom gate mode (DG-GBG) is a conventional "body-tied" SOI device; the reverse-DC-biased bottom gate mode (DG-RBG) is a high-Vt, low-leakage device for low power applications; and the forward-DC-biased bottom gate mode (DG-FBG) is a zero-Vt high-performance device.

MOS transistor operation in subthreshold, strong inversion, as well as JFET mode can be exploited in various imager circuit configurations including current mirrors, differential pairs, translinear loops, current conveyors, and pseudo-conductance networks. An entire family of linear and non-linear operations are thus possible using just a limited number of transistors.

In some examples, an active pixel sensor (APS) includes a photodetector such as, for example, a photodiode, photogate, avalanche photodiode, or other type of photodetector. Electrical circuit elements associated with signal sensing and readout are formed and can include multiple double-gate transistors. Readout circuitry can be formed in a first layer using CMOS, bipolar, SOI CMOS, or other semiconductor processes while a light absorption region can be formed in a second layer. Readout circuitry can include, for example, a reset switch, a buffer switch, and/or a row selection switch. For example, a buffer switch can comprise a source follower input transistor connected in series with a row selection switch so that when the row selection switch is activated, a signal from the active pixel sensor is transferred to a column bus. In some embodiments, readout circuitry such as a reset switch includes a p-type double gate MOSFET (DG-MOSFET) transistor. In additional examples, readout circuitry includes a DG-MOSFET transistor having a transfer gate and a sense node. Charge collected by a photodetector can be transferred to the sense node via a floating diffusion region and through the transfer gate.

In additional representative examples, an imager includes multiple active pixel sensors, circuitry for driving the active pixel sensors, and row and column decoders for selecting one or more pixels whose signals are to be read-out. Pixels can be configured to provide high quantum efficiency, low noise, low cross-talk, and pixels can be densely packed on a substrate. Other features of representative pixels include large charge handling capacities, large dynamic ranges, low power consumption high-speed operation, and radiation hardness. Arrays of such pixels can be readout randomly, binned, or windowed and non-destructive signal readout can be provided. Additional features include front-illuminated or back-illuminated operation.

In another representative embodiment, the double gate and variable threshold transistors can be used to improve the design and operation of CMOS active-pixel sensors by increasing the dynamic range of the device by reducing or eliminating the threshold voltage lost due to the in-pixel amplifier and to improve the output swing of the APS close to rail-to-rail.

Figure 7A:
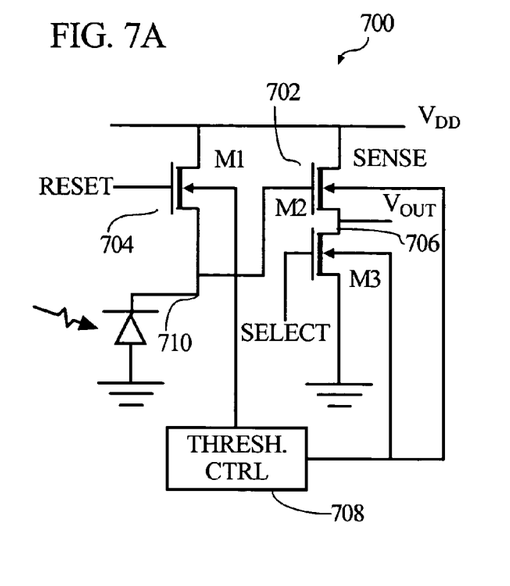
FIGS. 7A-7B illustrate a pixel that includes a double gated MOS FET reset transistor and an available output voltage range for such a pixel, respectively.
Figure 7B:
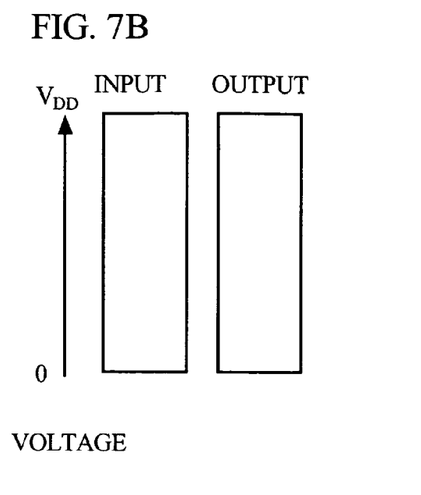
Figure 8:
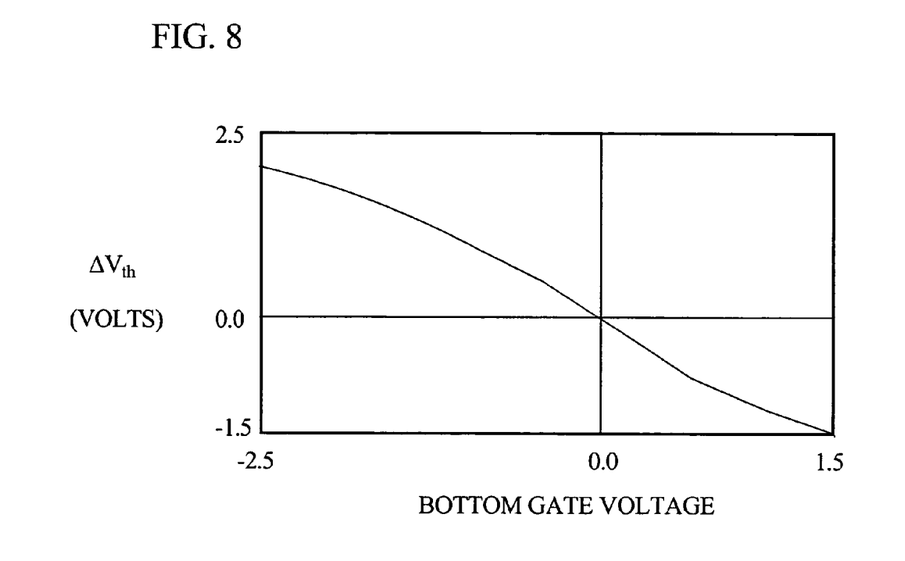
FIG. 8 is a graph representing exemplary threshold voltage changes as a function of voltage applied to a bottom gate terminal of a double gated MOS FET.

A representative embodiment of an APS pixel circuit 700 formed using variable threshold NMOS (DT-NMOS) transistors is shown in FIG. 7A. The APS circuit 700 includes variable threshold transistors 702, 704, 706 configured to hold captured charge, reset the pixel, and couple a pixel signal to, for example, a column conductor. A controller 708 is in communication a second gate (for example, a front gate or a back gate) of the reset transistor 704 to select a preferred transistor threshold, typically to provide soft reset (or so-called hard-to-soft reset) and increased total pixel voltage swing. In this example, using a VT-MOS transistor permits a voltage at an input node 710 to be as large as about $V_{DD}$ after reset. FIG. 7B illustrates available input/output voltage swings using such transistors, and comparison with FIGS. 3B and 4B shows considerable improvement in available voltage range. FIG. 8 shows change in threshold voltage as a function of bottom gate voltage with a representative VT-MOS transistor, and this function can be used by the controller 708 to select a control voltage (and threshold voltage) for the transistor 704.

Figure 13:
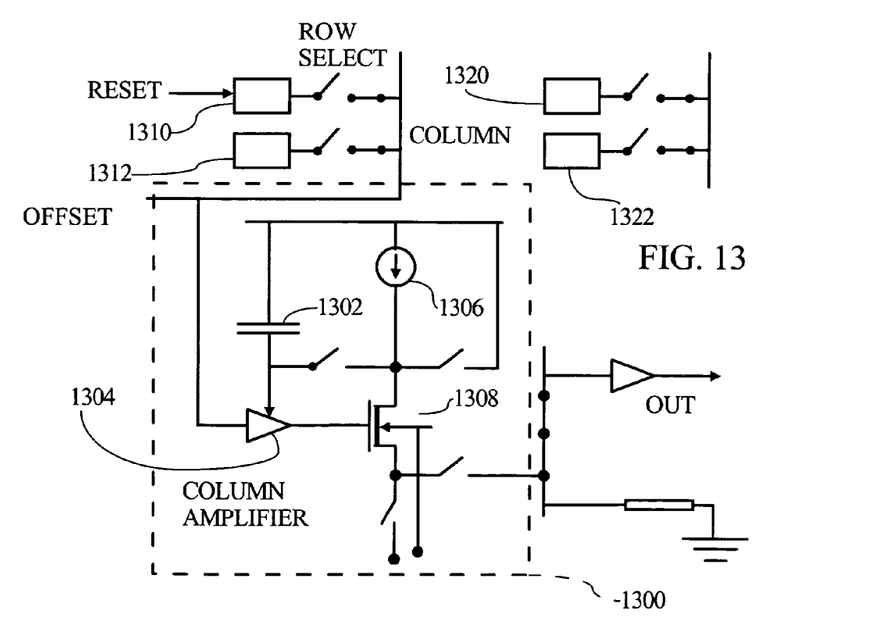
FIG. 13 is a schematic diagram of an offset regulated column amplifier.

With reference to FIG. 13, an offset regulated column amplifier 1300 includes an offset regulator implemented as, for example, a capacitor 1302, and an amplifier 1304 that can be implemented as a source follower. A column current source 1306 can be conveniently implemented as a current mirror, and a transistor 1308 is configured to receive an output from the amplifier 1304. Nonuniformities in the column amplifier 1300 are associated with the transistor 1308, the column current source 1306, and the amplifier 1304 (if used). In FIG. 13, representative pixels 1310, 1312 and 1320, 1322 of a first column and a second column, respectively, are illustrated, and other pixels are not shown. One or more of the thresholds of column amplifiers such as the column amplifier 1300 are associated with the transistor 1308, the column current source 1306, and the amplifier 1304 can be configured with a double gated FET to remove offsets within one or more of the columns.

Figure 9:
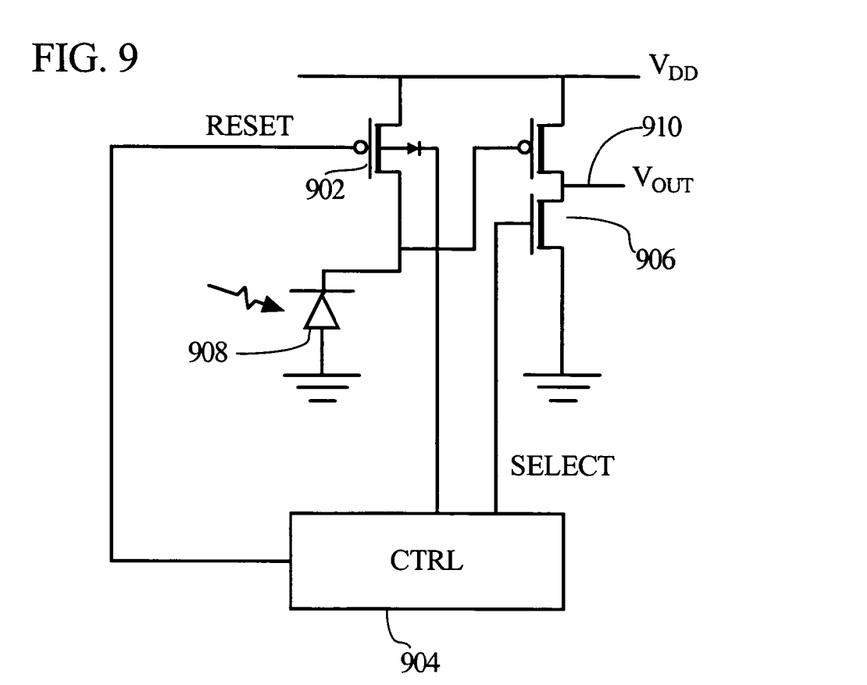
FIG. 9 is a schematic diagram of a pixel that includes a double gated PMOS FET reset transistor.

An exemplary embodiment of an APS pixel circuit that includes variable threshold PMOS transistors is shown in FIG. 9. A double gated PMOSFET 902 is coupled to serve as a reset transistor and receives a RESET signal and a THRESHOLD SELECT signal from a controller 904. A row select transistor 906 is configured to selectively couple signals from a photosensor 908 to an output 910. In this example as well, the controller 904 can be configured to apply a control signal to the reset transistor 902 so that a particular transistor threshold is selected. In the examples of FIGS. 7 and 9, an input node voltage can be as great as $V_{DD}$ after reset in contrast to conventional APS circuits in which input node reset voltages are limited by the threshold voltage $V_{RTTH}$.

In other examples, double gated and variable threshold transistors can be used to improve the design and operation of CMOS active-pixel sensors by reducing or eliminating image lag while providing low noise, linear response even under low illumination levels. Noise in photodiode-type CMOS active pixel sensors (APS) is primarily due to the reset noise (kTC) at the sense node, since it is difficult to implement in-pixel correlated double sampling for a 2-D array. In soft reset, the sense node does not charge up to the power-supply potential ($V_{DD}$), and sense node voltage after reset can depend strongly on the potential at the beginning of the reset. In hard reset, the sense node charges to a known potential, usually $V_{DD}$. Hard reset tends to reduce or eliminate image lag but is associated with increased read noise, dark current, and a reduced power-supply rejection ratio (PSRR). Soft reset is associated with low-noise output and a high PSRR. However, soft reset is associated with image lag of as much as 70 percent of the mean signal in the previous frame, and a markedly nonlinear response under low illumination. However, control of reset threshold voltage as described herein can provide the advantage of both hard and soft reset.

Keeping RST high during the idle phase enables flushing of unwanted charges, but solid state linearity is greatly degraded. The response non-linearity is due the weak-inversion current that causes SENSE to charge up in a slow logarithmic manner during the idle phase. If the current during the integration phase is small, the sense node is not discharged enough for the subsequent reset to affect the potential of the sense node. Consequently, the difference between the signal and the reset levels becomes extremely small for small signals, causing response non-linearity at low-light levels. Furthermore, under soft-reset, actual reset levels can vary depending upon the signal in the previous frame. Since the actual signal is derived by measuring the difference between the potential on the sense node before and after reset, variation of the reset level results in steady-state non-linearity due to modulation of the reset-level by the average signal strength. Under dynamic lighting conditions, the reset level will vary from one frame to another depending on the signal integrated in the previous frame. The variations on reset levels between successive defines the measure of image lag. Thus both steady-state and m response are degraded with soft-reset, even though it results in lower noise.

Pain et al., JPL NEW TECHNOLOGY REPORT NPO-207 16, and Pain et al., U.S. Patent App. Pub. 2003/0133625, that are incorporated herein by reference, describe active pixel sensor (APS) operations that eliminate the disadvantages described above by resetting pixels first by a hard reset and then by a soft reset. Hard reset erases the memory from the previous frame, eliminating image lag and nonlinearity, while soft reset allows reduced read noise. Thus, low noise, zero image lag, and high linearity can be achieved. As noted above, soft reset typically refers to reset with both drain and gate of an n-channel reset transistor at about the same potential, causing the sense node to be reset using sub-threshold MOSFET current.

Figure 10:
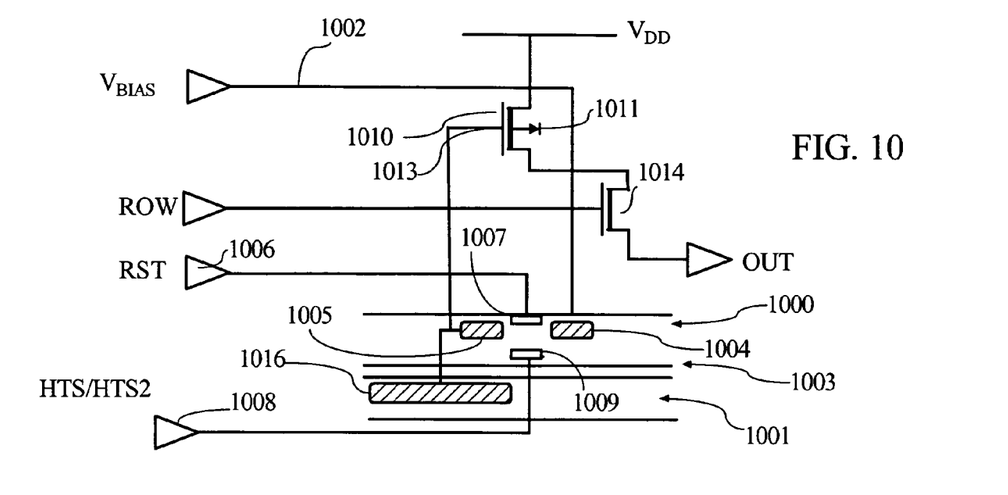
FIGS. 10-11 are schematic diagrams of pixels configured for flushed reset and hard-to-soft (HTS) reset, respectively, and that include a threshold control input.

FIG. 10 illustrates a pixel circuit that can provide hard and soft reset as well as threshold voltage control. In a so-called "flushed photodiode" arrangement, a pixel circuit contains a hard-to-soft (HTS) reset line 1002 for a row-decoded signal that controls a potential at a drain 1004 of a reset MOSFET. A reset (RST) signal is applied to a reset input 1006, and a pulsed input signal applied to HTS line 1002 reduces the drain potential, so that the pixel is reset in a hard reset mode. A threshold voltage control input 1008 is provided so that reset transistor threshold can be selected as well. As shown in FIG. 10, the pixel is defined in a SOI layer 1000 and a substrate layer 1001 that are separated by an insulator layer 1003. A reset transistor is defined by a source 1005, the drain region 1004, a top gate 1007, and a bottom gate 1009. A radiation detect ion region 1016 is defined in the substrate layer 1001. A row select transistor 1014 and a sense transistor 1010 having gates 1011, 1013 are also provided. While these and other portions of the pixel can be defined in the layers 1000, 1001, these features are not shown in this manner in FIG. 10.

Figure 12:
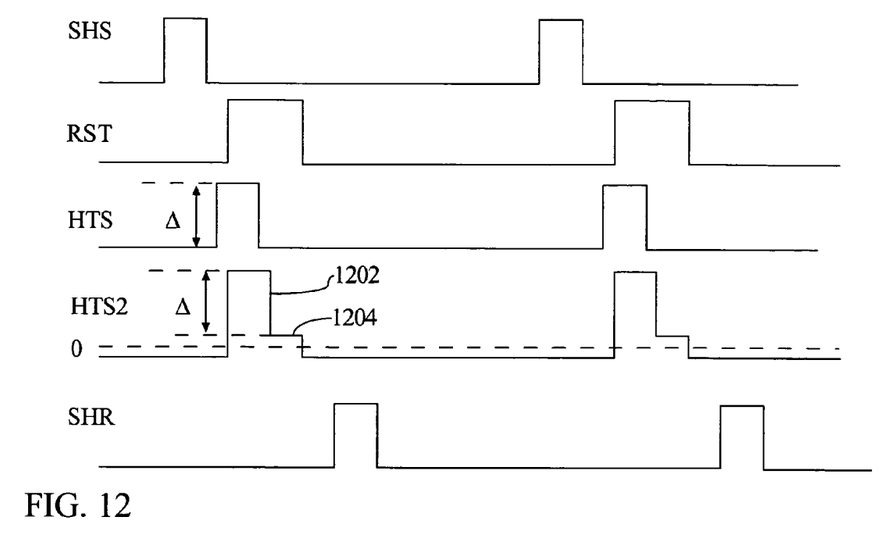
FIG. 12 is a representative timing diagram illustrating readout signals applied to pixels such as those illustrated in FIGS. 10-11.

FIG. 12 illustrates a representative timing diagram showing a hard reset (HST) pulse and the soft reset pulse (RST), and SHS and the SHR pulses indicating when the signal and the reset levels are sampled, respectively. Typically, imager output is based on a difference between the sampled signal and the sampled reset level. In an embodiment, RST is applied to the back gate (BG) of the reset transistor and HTS is applied to the top gate (TG) of the reset transistor. In another embodiment, HTS2 can be applied to the top gate (TG) of the reset transistor, and after the hard-to-soft reset, a negative voltage on the reset transistor can be applied to reduce leakage current. However, the RST pulse can be applied to the TG and the HTS pulse or the HTS2 pulse can be applied to the BG with similar results.

Figure 11:
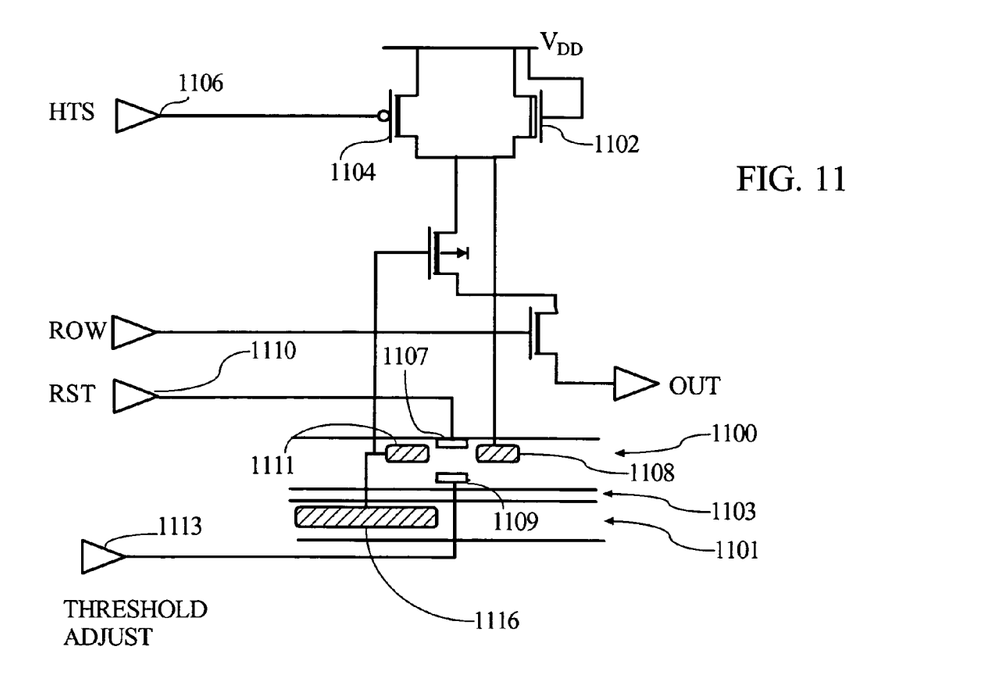

Another embodiment of a circuit with a so-called "hard-to-soft" (HTS) reset configuration with reset threshold adjustment is illustrated in FIG. 11. As shown in FIG. 11, $V_{DD}$ is routed to each column through a p-channel MOSFET 1104 and an n-channel MOSFET 1102. The gate of the p-channel MOSFET 1104 is connected to a HTS control input 1106 line, and the gate of the n-channel MOSFET 1102 is connected to $V_{DD}$. Sources of the MOSFETs 1102, 1104 are coupled to a reset transistor drain 1108. A reset input RST 1110 is coupled to a first reset transistor gate (a top gate), and a threshold voltage input 1113 is coupled to a second reset transistor gate (a bottom gate). In this embodiment, a negative voltage can be applied to the bottom gate (BG) 1109 of the reset transistor to reduce leakage currents. As shown in FIG. 11, the pixel is defined in a SOI layer 1100 and a substrate layer 1101 that are separated by an insulator layer 1103. A reset transistor is defined by a source 1111, the drain 1108, a top gate 1107, and a bottom gate 1109. A radiation detection region 1116 is defined in the substrate layer 1101. While other portions of the pixel (such as the MOSFETs 1102, 1004) are defined in the layers 1100, 1101, these are not shown in this manner in FIG. 11.

In an embodiment, variable threshold, double gate transistors are used in a SOI CMOS imager. The use of SOI CMOS transistors on SOI wafers can eliminate the need for the high-energy ion implantation processes that form deep n-type and p-type "twin" wells and field channel stop isolation regions that are presently required in leading edge bulk CMOS IC fabrication. Also, the formation of deep "triple well" structures using high energy ion implantation processes is unnecessary with SOI wafers to achieve voltage (electrical) isolation from the substrate.

In bulk CMOS photodetector processes, a photodiode such as, for example a n+/p photodiode, uses a p-well to form the photodiode, and sensing, amplification, and readout circuitry is generally limited to n-well devices. The use of only one type of transistor limits design flexibility and limits the dynamic range of the sensor. Because in SOI processes, the doping of the photodiode is in a first layer and is isolated from circuitry in a second layer, both n-type and p-type transistors can be used to form circuits for charge sensing, amplification, and readout. This allows sensing and amplification circuits that contain both p-type and n-type transistors as typically needed for efficient implementation of transimpedance and transconductance amplifiers.

Examples are described with reference to SOI processes that include silicon readout and detection layers that are separated by a silicon oxide layer. Other substrate materials, layer materials, and insulator layers can be used such as, for example, Ge, GaAs, InP, Se, InGaAs, or other or conductor, semiconductor, or insulator materials. In some examples, infrared sensitive materials such as germanium, GaAs, InGaAs, HgCdTe can be used to substantially increase imager response to infrared radiation.

In conventional CMOS technologies, transistors generally include a thin, high-quality gate oxide layer that can withstand sufficiently high total radiation doses. A LOCOS process is commonly used to isolate different devices. Such LOCOS oxide layers are typically between 400 and 1000 nm thick and they are of lesser quality than that of gate oxides. Positive charge trapping in the oxides in response to irradiation can result in a decrease in NMOS threshold voltage. However, as noted above, using a double gated MOSFET permits threshold voltage to be controlled to, for example, maintain a constant value of change programmably. Thus, a double gate structure permits superior control.

In additional examples, one or more gates of each transistor, including sense transistor, row/column select transistors, and reset transistors are coupled to an imager controller so that, for example, threshold voltage can be dynamically varied or set and controlled to a substantially constant value. Control values can be selected based on device aging, radiation damage, or irradiation level. For example, the effects of radiation-induced trapped charge in a BOX layer can be compensated.

Imager array controllers can be configured to provide threshold adjustment signals for reset, sense, select, or other imager transistors by varying a DC voltage, applying a predetermined time varying voltage, or based on a variable clock voltage that can be selected based on a digitized pixel signal.

In view of the many possible embodiments to which the principles of the disclosed technology may be applied, it should be recognized that the illustrated embodiments are only examples and should not be taken as limiting in any way. Rather, the scope of the invention is defined by the following claims. I therefore claim all that comes within the scope and spirit of these claims.

I claim:

1. An imaging system, comprising:
an array of pixels, each pixel including:
    a sense FET,
    a double gated reset FET, and
    a radiation detection region electrically coupled to the sense FET,
    wherein the sense FET is coupled to a source or drain of the double gated reset FET and at least one of the gates of the double gated reset FET is situated between a channel of the double gated reset FET and the radiation detection region; and
an array controller that hard resets a sense node and soft resets the sense node by applying a hard reset signal and a soft reset signal to one gate of the double gated reset FET in each pixel and that applies a threshold bias signal to the other gate of the double gated reset FET.

2. The imaging system of claim 1, wherein the hard and soft reset signals are selected to provide a predetermined image lag, dynamic range, and linearity based on an intended signal level in at least one radiation detection region.

3. The imaging system of claim 1, wherein the array controller provides the threshold bias signal to at least one gate of the double gated reset FETs in each pixel to bias the double gated reset FETs with respect to at least one of the hard reset signal and the soft reset signal.

4. The imaging system of claim 1, wherein the array controller is configured to provide a threshold bias signal to at least one gate of the double gated reset FETs in each pixel based on a digitized pixel signal associated with a selected pixel.

5. The imaging system of claim 1, wherein the threshold bias signal is based on charging of an insulating oxide region associated with an ionizing radiation flux incident to the array of pixels.

6. The imaging system of claim 1, wherein the threshold bias signal applied to the double gated reset FET in a selected pixel is based on a temperature of operation.

7. The imaging system of claim 1, wherein each of the double gated reset FETs includes a top gate and a bottom gate and the array controller applies a bias to the bottom gates to reduce sensitivity to radiation detection layer substrate bias.

8. The imaging system of claim 1, wherein the threshold bias signal is a positive or negative signal.

* * * * *